United States Patent
Cheng et al.

(10) Patent No.: US 10,892,364 B2
(45) Date of Patent: Jan. 12, 2021

(54) DIELECTRIC ISOLATED FIN WITH IMPROVED FIN PROFILE

(71) Applicant: INTERNATIONAL BUSINESS MACHINES CORPORATION, Armonk, NY (US)

(72) Inventors: Kangguo Cheng, Schenectady, NY (US); Bruce B. Doris, Brewster, NY (US); Darsen D. Lu, Mount Kisco, NY (US); Ali Khakifirooz, Los Altos, CA (US); Kern Rim, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

(21) Appl. No.: 15/800,740

(22) Filed: Nov. 1, 2017

(65) Prior Publication Data

US 2018/0122944 A1    May 3, 2018

Related U.S. Application Data

(60) Division of application No. 15/134,960, filed on Apr. 21, 2016, now Pat. No. 10,546,955, which is a
(Continued)

(51) Int. Cl.
*H01L 29/772* (2006.01)
*H01L 29/78* (2006.01)
(Continued)

(52) U.S. Cl.
CPC .... *H01L 29/7846* (2013.01); *H01L 21/02236* (2013.01); *H01L 21/3086* (2013.01); *H01L 21/30604* (2013.01); *H01L 21/311* (2013.01); *H01L 21/31051* (2013.01); *H01L 21/31111* (2013.01); *H01L 21/324* (2013.01);
(Continued)

(58) Field of Classification Search
CPC ............ H01L 29/66795; H01L 29/785; H01L 21/845; H01L 27/1211; H01L 29/7848; H01L 21/823431
See application file for complete search history.

(56) References Cited

U.S. PATENT DOCUMENTS 6,359,311 B1 * 3/2002 Colinge ............ H01L 29/42384
257/347
6,852,576 B2    2/2005 Lin et al.
(Continued)

*Primary Examiner* — Bradley Smith
*Assistant Examiner* — David J Goodwin
(74) *Attorney, Agent, or Firm* — Tutunjian & Bitetto, P.C.; Douglas Pearson

(57) ABSTRACT

A method of forming a fin structure that includes forming a plurality of fin structures from a bulk semiconductor substrate and forming a dielectric spacer on a sidewall of each fin structure in the plurality of fin structure. A semiconductor spacer is formed on a sidewall of the dielectric spacer. A dielectric fill is formed in the space between the adjacent fin structures. The semiconductor spacer and a portion of the fin structures that is present below a lower surface of the dielectric spacer are oxidized. Oxidizing a base portion of the fin structures produces a first strain and oxidizing the semiconductor spacer produces a second strain that is opposite the first strain.

13 Claims, 9 Drawing Sheets

Related U.S. Application Data continuation of application No. 14/189,294, filed on Feb. 25, 2014, now Pat. No. 9,548,213.

(51) Int. Cl.
| | |
|---|---|
| *H01L 29/66* | (2006.01) |
| *H01L 21/311* | (2006.01) |
| *H01L 21/308* | (2006.01) |
| *H01L 21/306* | (2006.01) |
| *H01L 21/324* | (2006.01) |
| *H01L 29/10* | (2006.01) |
| *H01L 21/02* | (2006.01) |
| *H01L 21/3105* | (2006.01) |
| *H01L 21/762* | (2006.01) |
| *H01L 29/06* | (2006.01) |

(52) U.S. Cl.
CPC .... *H01L 21/76224* (2013.01); *H01L 29/0653* (2013.01); *H01L 29/1054* (2013.01); *H01L 29/6653* (2013.01); *H01L 29/6656* (2013.01); *H01L 29/66553* (2013.01); *H01L 29/66795* (2013.01); *H01L 29/785* (2013.01); *H01L 29/7851* (2013.01)

(56) References Cited

U.S. PATENT DOCUMENTS

| | | | |
|---|---|---|---|
| 6,951,783 B2 | 10/2005 | Mathew et al. | |
| 6,962,843 B2 | 11/2005 | Anderson et al. | |
| 7,247,908 B2 | 7/2007 | Anderson et al. | |
| 8,076,190 B2 | 12/2011 | Chen et al. | |
| 8,148,755 B2 | 4/2012 | Gilgen et al. | |
| 8,357,569 B2 | 1/2013 | Pawlak | |
| 8,390,040 B2 | 3/2013 | Ban et al. | |
| 9,117,875 B2* | 8/2015 | Jacob | H01L 21/76224 |
| 9,349,658 B1* | 5/2016 | Jacob | H01L 21/845 |
| 9,799,676 B2* | 10/2017 | Xie | H01L 27/1211 |
| 2008/0001225 A1 | 1/2008 | Furukawa et al. | |
| 2010/0109045 A1 | 5/2010 | Liu et al. | |
| 2010/0144121 A1* | 6/2010 | Chang | H01L 29/1054 |
| | | | 438/478 |
| 2010/0163971 A1* | 7/2010 | Hung | H01L 29/1083 |
| | | | 257/327 |
| 2012/0012932 A1* | 1/2012 | Perng | H01L 29/165 |
| | | | 257/347 |
| 2012/0276695 A1 | 11/2012 | Cheng et al. | |
| 2013/0154001 A1* | 6/2013 | Cai | H01L 29/66795 |
| | | | 257/347 |
| 2014/0167163 A1 | 6/2014 | Cheng et al. | |
| 2014/0353731 A1 | 12/2014 | Colinge et al. | |
| 2015/0021709 A1* | 1/2015 | Jacob | H01L 27/1211 |
| | | | 257/401 |
| 2015/0206939 A1 | 7/2015 | Huang et al. | |
| 2015/0303274 A1 | 10/2015 | Zhu et al. | |
| 2015/0303282 A1* | 10/2015 | Morin | H01L 29/7843 |
| | | | 438/283 |
| 2016/0329253 A1* | 11/2016 | Liu | H01L 21/823821 |

\* cited by examiner

DIELECTRIC ISOLATED FIN WITH IMPROVED FIN PROFILE

BACKGROUND

Technical Field

The present disclosure relates generally to semiconductor fabrication, and more particularly to structures and methods for forming fin field effect transistors (FinFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink. However, the cost of manufacturing SOI finFETs can be high.

SUMMARY

In one embodiment, a fin structure is formed by a method that includes forming a plurality of fin structures from a bulk semiconductor substrate, and forming a dielectric spacer on a sidewall of the plurality of fin structure. A semiconductor spacer is formed on a sidewall of the dielectric spacer. An exposed portion of the bulk substrate that is present between the semiconductor spacers on adjacent fin structures is etched to form a pedestal portion of the bulk substrate. A dielectric fill is formed in the space between the adjacent fin structures. The semiconductor spacer and a portion of the fin structures that is present below a lower surface of the dielectric spacer are annealed, wherein the annealing of the portions of the fin structures that are below the lower surface of the dielectric spacer produces a first strain and annealing the semiconductor spacer produces a second strain that is opposite the first strain.

In another embodiment, a fin structure is formed by a method that includes forming a plurality of fin structures from a bulk semiconductor substrate. A first dielectric fill is formed in the space between the adjacent fin structures. The sidewalls of the upper portion of the plurality of fin structures are exposed. A dielectric spacer is formed on the exposed sidewalls of at least one fin structure in the plurality of fin structure. A semiconductor spacer is formed on a sidewall of the dielectric spacer. A second dielectric fill is formed on the space between the adjacent fin structures on the first dielectric fill. The semiconductor spacer and a portion of the fin structures that is present below a lower surface of the dielectric spacer is annealed, wherein annealing the portion of the fin structures below the lower surface of the dielectric spacer produces a first strain and annealing the semiconductor spacer produces a second strain that is opposite the first strain.

In another aspect of the present disclosure, a fin field effect transistor (finFET) is provided having a uniform tail region. In one embodiment, the finFET includes a fin structure that is present on a dielectric surface. The fin structure includes a uniform tail region that is present at an interface of the fin structure and dielectric surface. A gate structure is present on a channel portion of the fin structure and includes a gate dielectric in contact with the channel portion of the fin structure and at least one gate conductor. A source region and a drain region are present on opposing sides of the channel portion of the fin structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
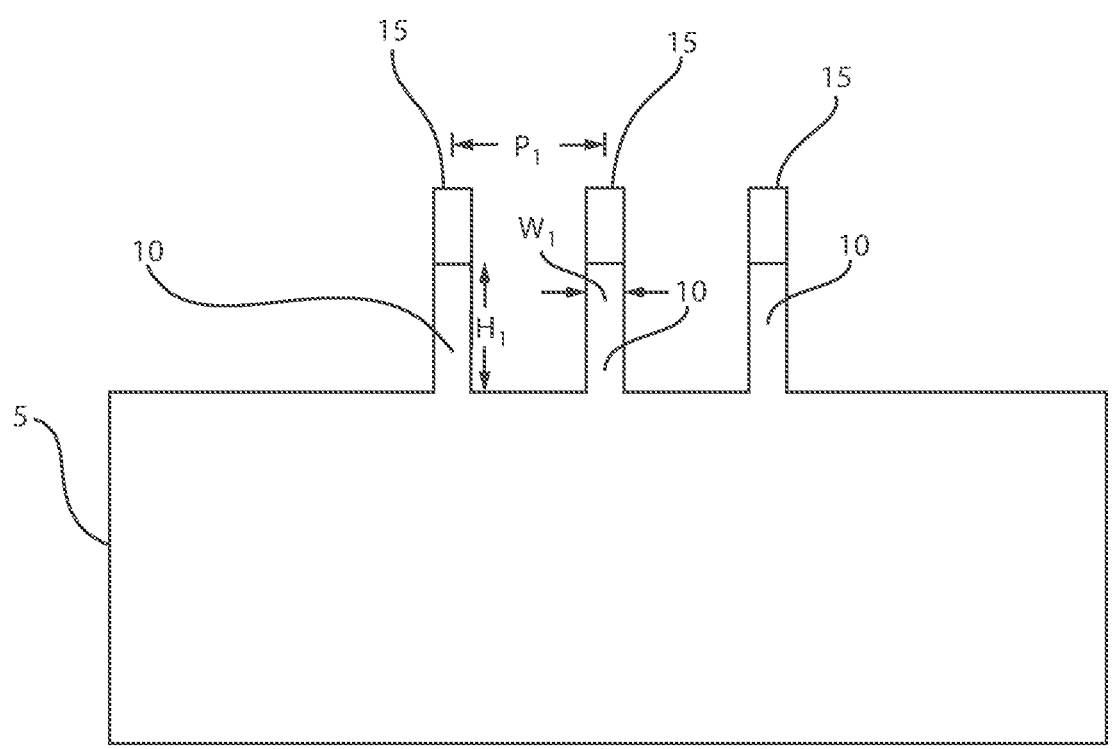
FIG. 1 is a side cross-sectional view of forming a plurality of fin structures from a bulk semiconductor substrate, in accordance with one embodiment of the present disclosure

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a region of a dielectric material, e.g., oxide, under a fin structure that is formed from a bulk semiconductor substrate. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. In some embodiments, the methods and structures disclosed herein substantially reduce or eliminate stresses induced in the fin structures from the underlying region of the dielectric material, e.g., oxide, by oxidizing a semiconductor spacer that is adjacent to the fin structures. Oxidizing the semiconductor spacer produces a compensatory stress that neutralizes the stress being formed in the fin structures by the underlying region of dielectric material. The methods and structures of the present disclosure are now discussed with more detail referring to FIGS. 1-16.

FIG. 1 depicts one embodiment of forming a plurality of fin structures 10 from a bulk semiconductor substrate 5. A "bulk semiconductor substrate" is a substrate that is composed of a single semiconductor material. A bulk semiconductor substrate 5 does not include a buried dielectric layer that is typically present in silicon on insulator (SOI) substrates. The semiconductor material that provides the bulk semiconductor substrate 5 may be a semiconducting material including, but not limited to silicon, strained silicon, a silicon carbon alloy (e.g., silicon doped with carbon (Si:C), silicon germainum, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The plurality of fin structures 10 may be formed from the bulk semiconductor substrate 5, using photolithography and etch processes. For example, prior to etching the bulk semiconductor substrate 5 to provide the plurality of fin structures 10, a layer of the dielectric material is deposited atop the upper surface of the bulk semiconductor substrate 5 to provide a dielectric fin cap 15. The material layer that provides the dielectric fin cap 15 may be composed of a nitride, oxide, oxynitride material, and/or any other suitable dielectric layer. The dielectric fin cap 15 may comprise a single layer of dielectric material or multiple layers of dielectric materials. The material layer that provides the dielectric fin cap 15 can be formed by a deposition process, such as chemical vapor deposition (CVD) and/or atomic layer deposition (ALD). Alternatively, the material layer that provides the dielectric fin cap 15 may be formed using a growth process, such as thermal oxidation or thermal nitridation. The material layer that provides the dielectric fin cap 15 may have a thickness ranging from 1 nm to 100 nm. In one example, the dielectric fin cap 15 is composed of an oxide, such as $SiO_2$, that is formed by CVD to a thickness ranging from 25 nm to 50 nm.

In one embodiment, following the formation of the layer of dielectric material that provides the dielectric fin cap 15, a photolithography and etch process sequence is applied to the material layer for the dielectric fin cap 15 and the bulk semiconductor substrate 5. Specifically, in one example, a photoresist mask is formed overlying the layer of the dielectric material that provides dielectric fin cap 15 and is present overlying the bulk semiconductor substrate 5, in which the portion of the dielectric material that is underlying the photoresist mask provides the dielectric fin cap 15, and the portion of the bulk semiconductor substrate 5 that is underlying the photoresist mask provides the plurality of fin structures 10. The exposed portions of the dielectric material that provides dielectric fin cap 15 and the portion of the bulk semiconductor substrate 5, which are not protected by the photoresist mask, are removed using a selective etch process. To provide the photoresist mask, a photoresist layer is first positioned on the layer of the dielectric material that provides dielectric fin cap 15. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 15 followed by removing a portion of the exposed bulk semiconductor substrate 5 selectively to the photoresist mask. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height of the fin structures 10.

Each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the plurality of fin structures 10 may have a width $W_1$ of less than 20 nm. In another embodiment, each of the fin structures 10 has a width $W_1$ ranging from 3 nm to 8 nm. Although three fin structures 10 are depicted in FIG. 1, the present disclosure is not limited to only this example. It is noted that any number of fin structures 10 may be formed from the bulk semiconductor substrate 5. The pitch P1 separating adjacent fin structures in the plurality of fin structures 10 may range from 15 nm to 200 nm. In another example, the pitch P1 separating adjacent fin structures 10 may range from 15 nm to 100 nm.

Figure 2:
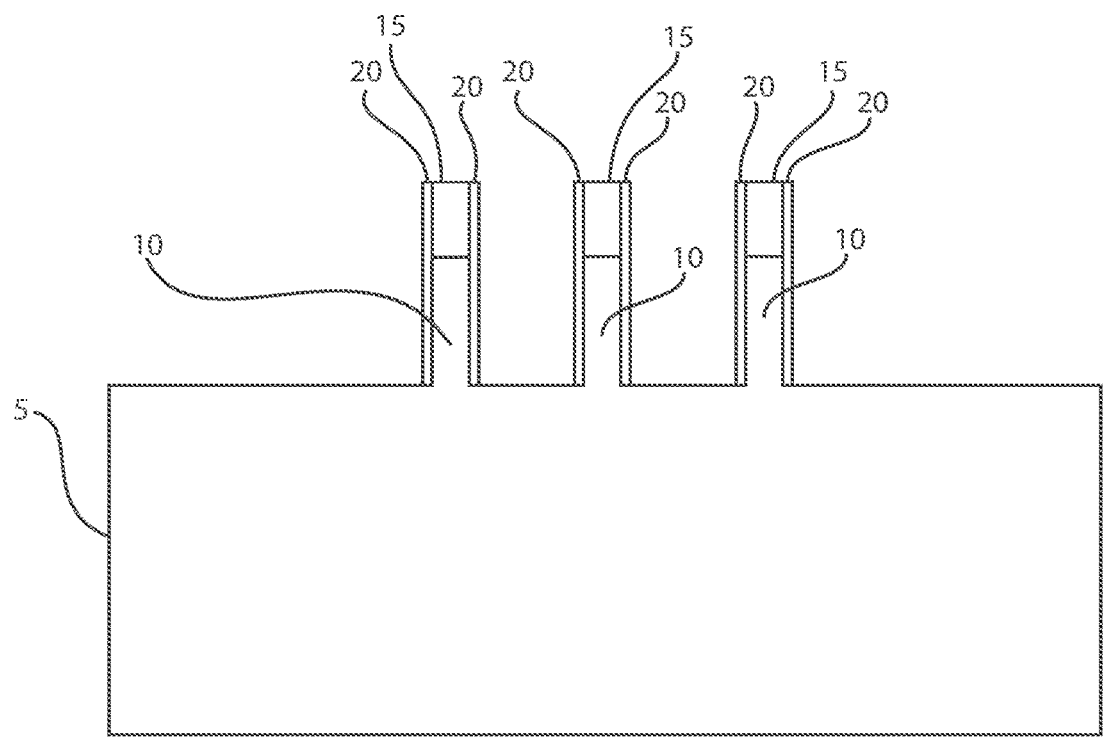
FIG. 2 is a side cross-sectional view depicting forming a dielectric spacer on a sidewall of at least one fin structure in the plurality of fin structures, in accordance with one embodiment of the present disclosure.

FIG. 2 depicts one embodiment of forming a dielectric spacer 20 on a sidewall of each fin structure 10. The dielectric spacer 20 typically extends across an entirety of a height of the sidewall for each of the plurality of fin structures 10, and in some embodiments may extend onto the sidewall of the dielectric fin cap 15. The dielectric spacer 20 is typically composed of a dielectric material, such as an oxides (with the exception of silicon oxide), nitrides or oxynitrides (with the exception of silicon oxynitride). In some examples, the dielectric spacer 20 may be composed of hafnium oxide ($HfO_2$), silicon carbides (SiCN), silicon carbonitrides, silsequioxanes, siloxanes, boron phosphate silicate glass (BPSG) and combinations thereof.

In one embodiment, the dielectric spacer 20 may be formed by a process sequence that includes depositing a conformal dielectric layer on the plurality of the fin structures 15 and an exposed upper surface of the bulk semiconductor substrate 5 that is present between adjacent fin structures 10. The term "conformal" denotes a layer having a thickness that does not deviate from greater than or less than 30% of an average value for the thickness of the layer. In some embodiments, the conformal dielectric layer for forming the dielectric spacer 20 may be formed using a CVD process, such as PECVD, or the conformal dielectric layer may be deposited using a spin on deposition process. Following deposition of the conformal dielectric layer, an anisotropic etch process may remove the horizontal portions of the conformal dielectric layer, wherein the vertical portions of the conformal dielectric layer remain to provide the dielectric spacer 20. The horizontal portions of the conformal dielectric layer are the portions of the dialectic layer that are present on the upper surface of the dielectric fin cap 15 and the surfaces of the portion of the bulk semiconductor substrate 5 that are present between adjacent fin structures 10. The anisotropic etch process for removing the horizontal portions of the conformal dielectric layer may be a RIE process. The width of the dielectric spacer 20 may range from 3 nm to 15 nm.

Figure 3:
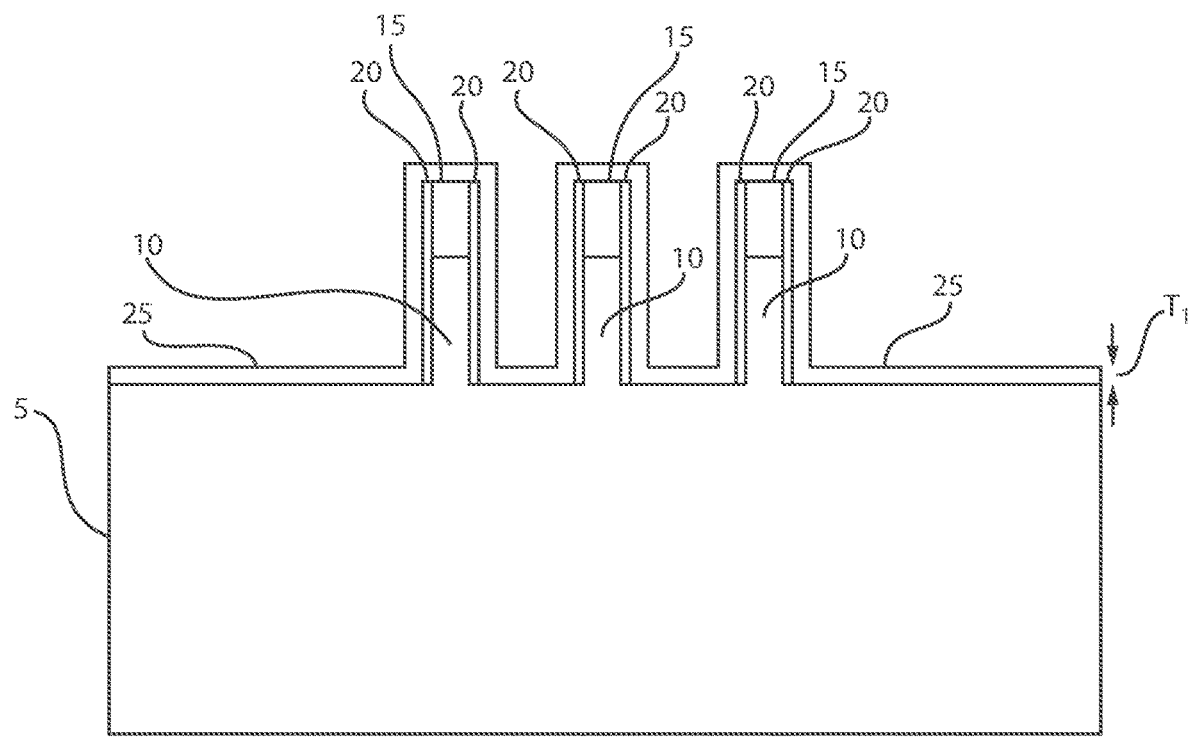
FIG. 3 is a side cross-sectional view depicting one embodiment of forming a conformal layer of a semiconductor material on the dielectric spacer, the plurality of fin structures and upper surface of bulk substrate that is present between adjacent fin structures in the plurality of fin structures, in accordance with the present disclosure.

FIG. 3 depicts one embodiment of forming a conformal layer of a semiconductor material 25 on the dielectric spacer 20, the dielectric fin cap 15, the plurality of fin structures 10 and upper surface of bulk semiconductor substrate 5 that is present between adjacent fin structures 10. The conformal layer of semiconductor material 25 may be composed of an amorphous semiconductor material or a multi-crystalline, e.g., polycrystalline, semiconductor material. An amorphous semiconductor material is a non-crystalline material that lacks the long-range order characteristic of a crystal. A polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). The term polycrystalline typically refers to small grains (hundreds of nanometers, to hundreds of microns).

In one embodiment, the conformal layer of the semiconductor material 25 may be composed of a silicon containing material. Examples of silicon-containing materials suitable for the semiconductor material include, but are not limited to, Si, SiGe, SiGeC, SiC, polysilicon, i.e., polySi, amorphous Si, i.e., α:Si, and multi-layers thereof. The silicon-containing materials may also include hydrogen, such as hydrogenated silicon (Si:H) or amorpohous hydrogenated silicon (α-Si:H). It is noted that the above materials are provided for illustrative purposes only, and are not intended to limit the present disclosure, as other materials are suitable for provided the conformal layer of the semiconductor material 25. For example, any semiconductor material that provides a strain following oxidation may be suitable for use as the material of the conformal layer of the semiconductor material 25 with the methods and structures of the present disclosure. The conformal layer of the semiconductor material 25 may have a thickness T1 ranging from 3 nm to 30 nm. In another embodiment, the conformal layer of the semiconductor material 25 may have a thickness T1 ranging from 3 nm to 10 nm. The conformal layer of the semiconductor material 25 may be deposited using a CVD process, such as Atmospheric Pressure CVD (APCVD), Low Pressure CVD (LPCVD), Plasma Enhanced CVD (EPCVD), Metal-Organic CVD (MOCVD), atomic layer deposition (ALD) and combinations thereof may also be employed.

Figure 4:
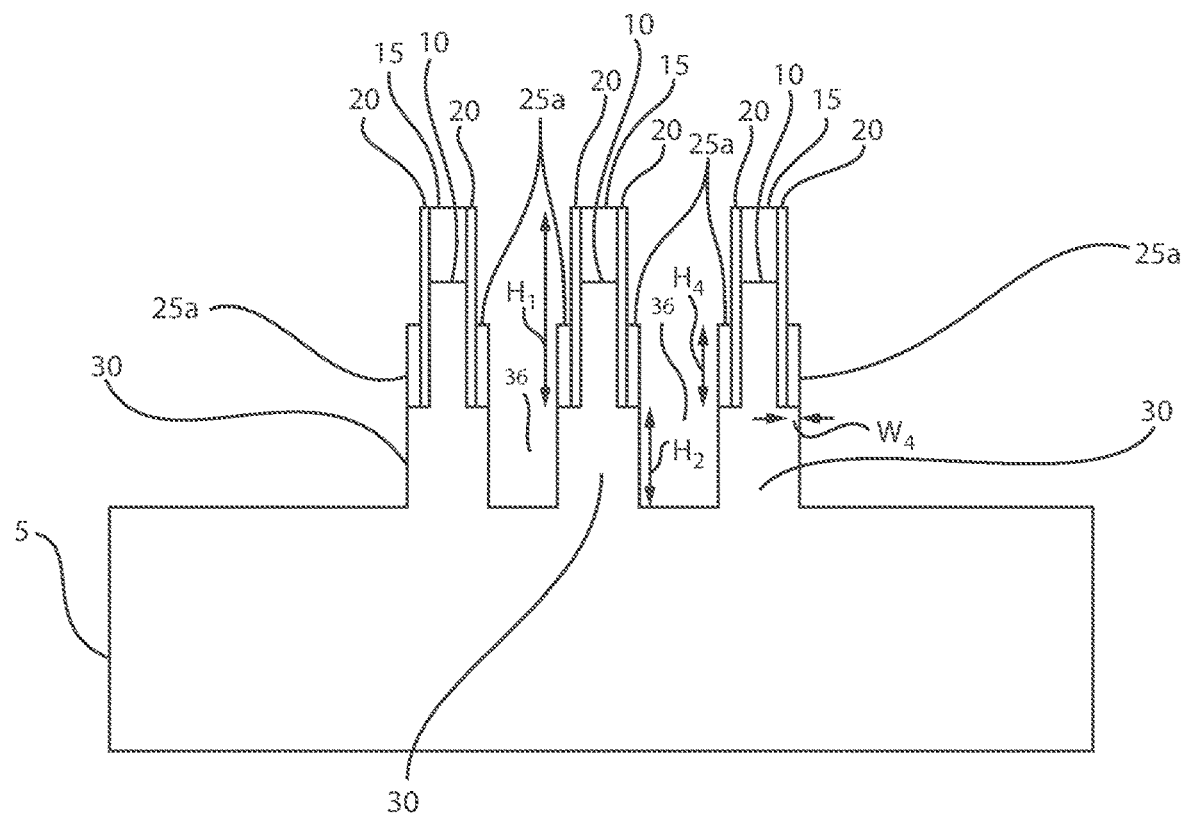
FIG. 4 is a side cross-sectional view depicting one embodiment of etching the conformal layer of the semiconductor material to provide semiconductor spacers on a sidewall of the dielectric spacer, and etching an exposed portion of the bulk substrate to provide a pedestal portion of the bulk substrate, in accordance with the present disclosure.

FIG. 4 depicts one embodiment of etching the conformal layer of the semiconductor material to provide semiconductor spacers 25a on a sidewall of the dielectric spacer 20, and etching an exposed portion of the bulk semiconductor substrate 5 to provide a pedestal portion 30 of the bulk semiconductor substrate 5. The etch process for forming the semiconductor spacers 25a and the pedestal portion 30 of the bulk semiconductor substrate 5 may be a anisotropic etch, such as RIE, ion beam etching, plasma etching or laser ablation. The etch process for forming the semiconductor spacers 25a and the pedestal portion 30 of the bulk semiconductor substrate 5 may be an etch that removes the material of the semiconductor spacers 25a and the bulk semiconductor substrate 5 selectively to the material of the dielectric fin cap 15. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

In some embodiments, the etch process for forming semiconductor spacers 25a and the pedestal portion 30 of the bulk semiconductor substrate 5 is continued until the horizontal portions of the conformal layer of the semiconductor material are removed in their entirety, and the remaining vertical portions of the conformal layer of the semiconductor material that are present on the sidewalls of the dielectric spacer 20 are recessed so that the height of the semiconductor spacers 25a is less than half the height H1 of the fin structures 10. The portion of the bulk semiconductor substrate 5 that is present between the semiconductor spacers 25a is etched to provide a trench 35 having a height H2 ranging from 10 nm to 200 nm. The depth H2 of the trench 35 defines the height of the pedestal portion 30 of the fin structures 10.

In one embodiment, the height H4 of the semiconductor spacers 25a ranges from 10 nm to 100 nm. In another embodiment, the height H4 of the semiconductor spacers 25a ranges from 20 nm to 50 nm. In one embodiment, the width W4 of the semiconductor spacers 25a ranges from 3 nm to 30 nm. In yet another embodiment, the width W4 of the semiconductor spacers 25a ranges from 3 nm to 10 nm.

Figure 5:
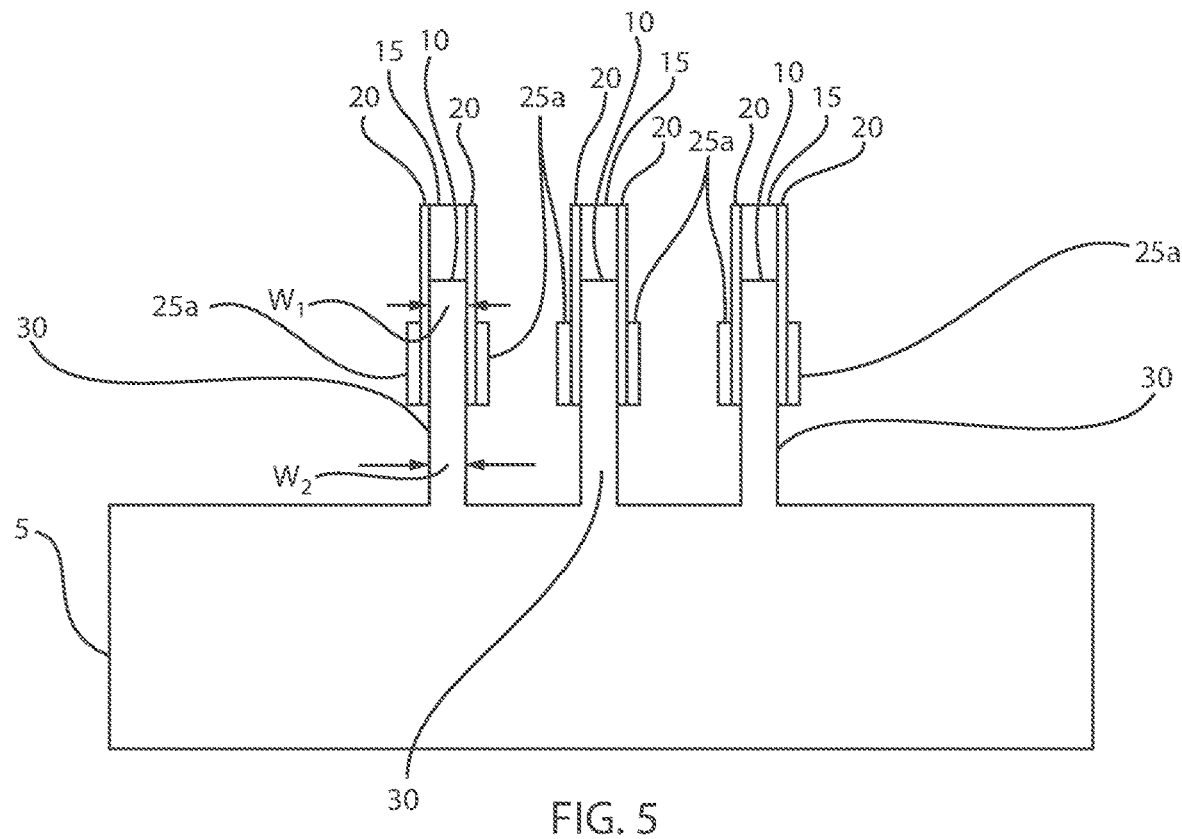
FIG. 5 is a side cross-sectional view depicting etching the pedestal portion of the fin structures to reduce the width of the pedestal portion to be substantially equal to the width of the upper portion of the fin structures, in accordance with one embodiment of the present disclosure.

FIG. 5 depicts one embodiment of etching the pedestal portion 30 of the fin structures 10 to reduce the width W2 of the pedestal portion 30 to be substantially equal to the width W1 of the fin structures 10. "By substantially equal" it is meant that the width W2 of the pedestal portion 30 may be within +/−5 nm of the width W1 of the fin structures 10. In one embodiment, the pedestal portion 30 may be etched using an isotropic etch. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma. The etch process for reducing the width W2 of the pedestal portion 30 of the fin structures 10 may be selective to the semiconductor spacers 25a, the dielectric spacers 20, and the dielectric fin cap 15. In some embodiments, the step of etching the pedestal portion 30 of the fin structures 10 may be omitted.

Figure 6:
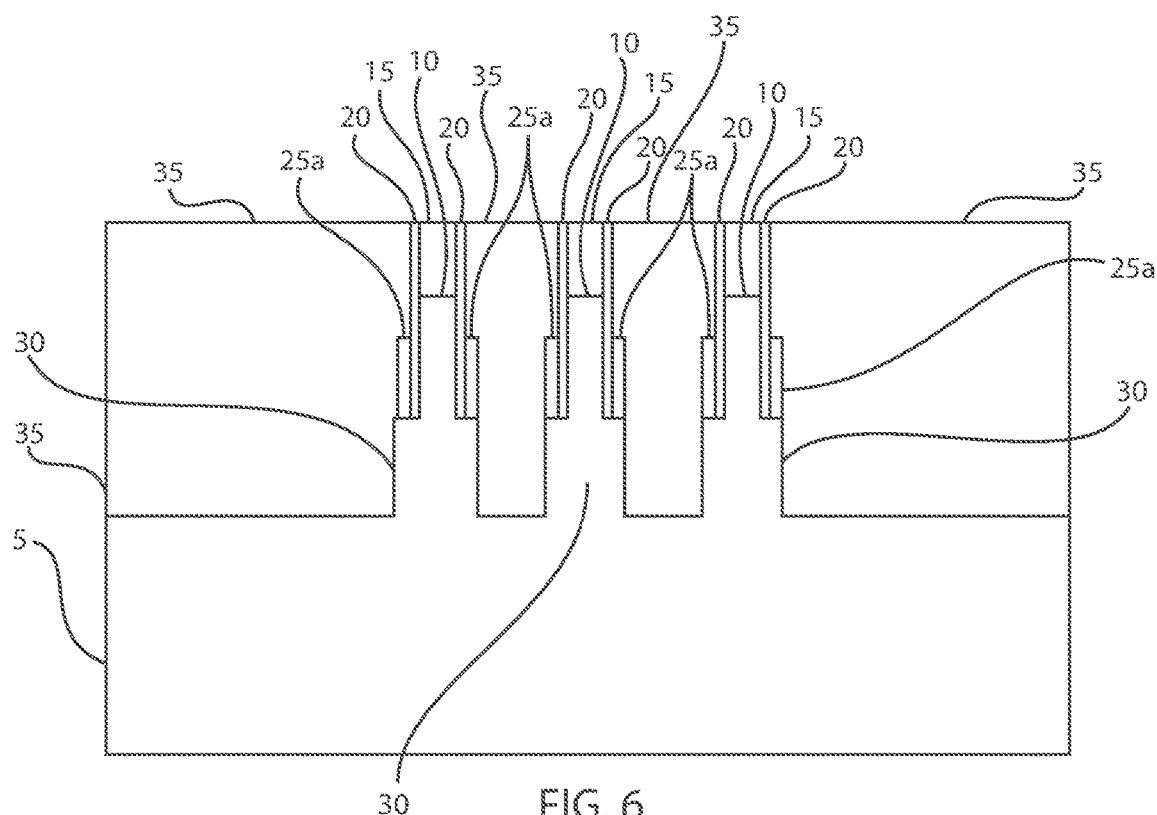
FIG. 6 is a side cross-sectional view depicting forming a dielectric fill in the space between the adjacent fin structures.

FIG. 6 depicts one embodiment of forming a dielectric fill 35 in the space between the adjacent fin structures 10 including the trenches between the pedestal portions 30 of the fin structures 10. Although FIG. 6 depicts forming the dielectric fill 35 between the adjacent fin structures 10 that are depicted in FIG. 4, the step of forming the dielectric fill 35 is equally applicable to the embodiments of the present disclosure that include the step of reducing the width of the pedestal portion 30 of the fin structures 10 as described above with reference to FIG. 5.

Referring to FIG. 6, the dielectric fill 35 may be an oxide containing material. For example, the dielectric fill 35 may be silicon oxide ($SiO_2$). Other examples of materials that may be employed for the dielectric fill 35 include silicon nitride, silicon oxynitride, hafnium oxide, hafnium oxynitride, alumina and combinations thereof. The dielectric fill 35 may be formed using CVD, PECVD, high-density plasma CVD (HPCVD), chemical solution deposition or a spin-on glass process. Following deposition, the material for the dielectric fill 35 may be planarized so that the upper surface of the dielectric fill is coplanar with the upper surface of the dielectric fin cap 15.

Figure 7:
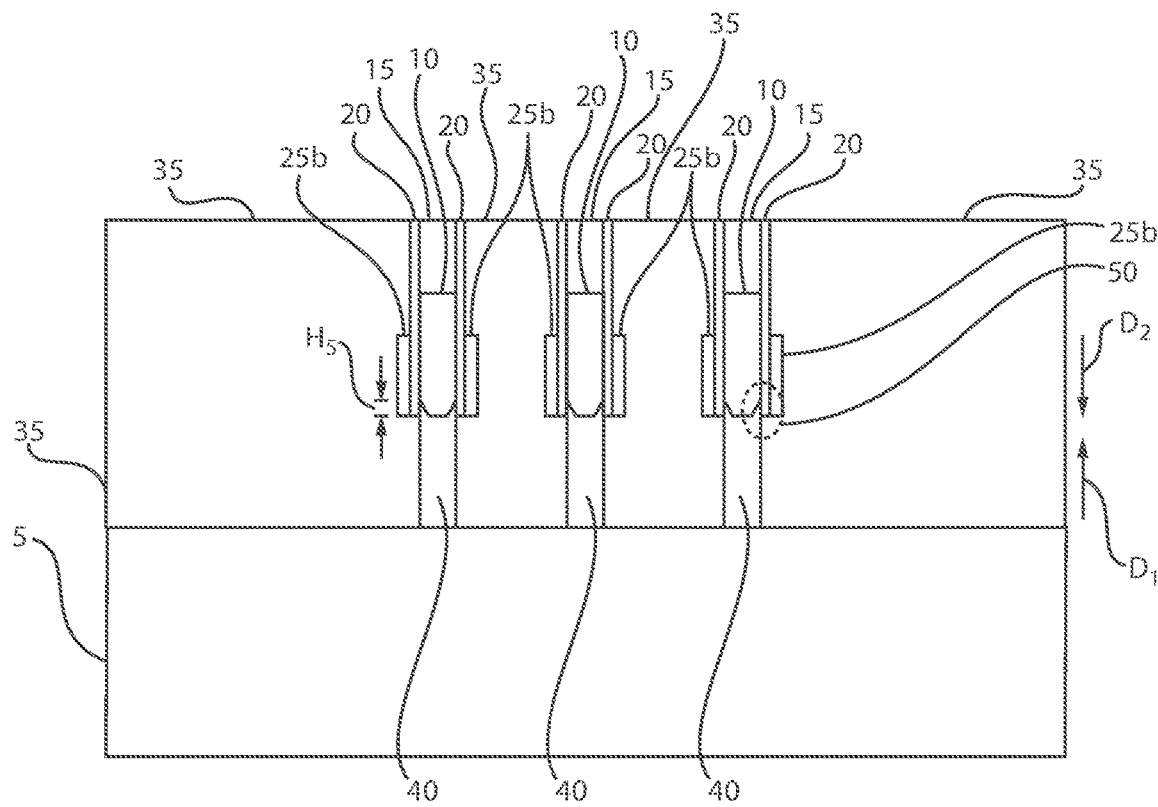
FIG. 7 is a side cross-sectional view depicting oxidizing a portion of the fin structures that is present below a lower surface of the dielectric spacer, in accordance with one embodiment of the present disclosure.

FIG. 7 depicts oxidizing a portion (hereafter referred to as oxidized base portion 40) of the fin structures 10 that is present below a lower surface of the dielectric spacer 20. During the oxidation of the fin structure 10 to provide the oxidized base portion 40, the semiconductor spacer is also oxidized (hereafter referred to as oxidized semiconductor spacer 25b). The oxidized base portion 40 produces a first strain and the oxidized semiconductor spacer 25b produces a second strain that is opposite the first strain. For example, oxidizing the portion of the fin structures 10 to provide the oxidizing base portion 40 produces an intrinsic strain within the oxidized base portion 40. The term "intrinsic strain" as used herein refers to a stress or presence of a strain, either compressive or tensile, which is developed during preparation of a structure and can therefore be retained in the structure without external force. The mechanical strain can be imparted to the fin structure 10, due to volume expansion of the oxide as compared with silicon. The intrinsic strain that is present in the oxidized base portion 40 induces a strain on the overlying fin structures 10. Therefore, the direction of the strain is in a direction, i.e., first direction D1, that extends from the base of the fin structure 10 towards an upper surface of the fin structure 10. The intrinsic strain that is present in the oxidized base portion 40 of the fin structures 10 may range from 0.3 GPa tensile to −0.3 GPa compressive strain. In the embodiments, in which the pedestal portion 30 is not laterally etched, the oxidized base portion 40 may have a width W3 ranging from 15 nm to 50 nm, and a height H3 ranging from 10 nm to 200 nm. In another embodiment, in which the pedestal portion 30 is not laterally etched, the oxidized base portion 40 may have a width W3 ranging from 15 nm to 35 nm, and a height H3 ranging from 35 nm to 70 nm.

Substantially simultaneously with the oxidizing of the fin structure 10 to provide the oxidized base portion 40, the semiconductor spacer is also oxidized to form the oxidized semiconductor spacer 25b, which has a second strain in a direction D2 opposite to the direction D1 of first strain produced by the oxidized base portion 40. The strain produced in the oxidized semiconductor spacer 25b may be an intrinsic strain. More specifically, the intrinsic strain that is present in the oxidized semiconductor spacer 25b may range from 0.3 GPa tensile to −0.3 GPa compressive stress. The oxidized semiconductor spacer 25b is formed on a sidewall of the fin structure 10 and induces a strain in an opposite direction, i.e., second direction D2, as the strain being induced by the oxidized base portion 40. For example, the direction of the strain, i.e., second direction D2, induced by the oxidized semiconductor spacer 25b may extend in a direction from the oxidized semiconductor spacer 25b towards the oxidized base portion 40.

The strain produced by the oxidized semiconductor spacer 25 in the second direction D2 opposes the strain produced by the oxidized base portion 40 in the first direction D1 to provide a fin structure 10 that is substantially relaxed. The substantially relaxed fin structure 10 may also be referred to as having a substantially neutral strain state. In some embodiments, a fin structure that is substantially relaxed is a fin structure 10 having a strain no greater than about +/−0.1 GPa tensile or compressive. In some embodiments, the strain that can be measured in the fin structure 10 that results from the opposing strains produced by the oxidized semiconductor spacer 25b and the oxidized base portion 40 may range from 0.1 GPa tensile to −0.1 GPa compressive strain. In yet another embodiment, the strain that can be measured in the fin structure 10 that results from the opposing strains produced by the oxidized semiconductor spacer 25b and the oxidized base portion 40 may range from 0.05 GPa tensile to −0.05 GPa compressive strain. In one example, the fin structure 10 may be completely relaxed.

In some embodiments, the oxidation process that produces the oxidized semiconductor spacer 25b and the oxidized base portion 40 may be a thermal oxidation process. Typically, the thermal oxidation process includes annealing in an oxygen containing atmosphere, which may include a hydrogen carrier gas. In some embodiments, the oxidation occurs in a furnace set to a temperature in the range of 900° C. to 1300° C. In another embodiment, the oxidation occurs in a furnace set to a temperature in the range of 950° C. to 1200° C. In some embodiments, oxygen from the furnace atmosphere diffuses through the dielectric fill 35 to react with the semiconductor material, e.g., silicon, of the bulk semiconductor substrate 5 and the semiconductor spacers 25a, forming oxide, which includes the oxidized semiconductor spacer 25b and the oxidized base portion 40 formed at the base of the fin structure 10, leaving an unoxidized portion of the fin structure 10 present between the dielectric fin cap 15 and the oxidized base portion 40. The oxide of the oxidized semiconductor spacer 25b and the oxidized base portion 40 may be silicon oxide ($SiO_2$).

In some embodiments, an oxide region 50 having a triangular-shaped cross-section or tail profile (hereafter referred to as a tail region 50) is present at an interface between the unoxidized portion of the fin structure 10 and the oxidized base portion 40 of the fin structure 10. In some embodiments, the tail region 50 may be uniform. As used herein, a "uniform" tail region 50 is a tail region having a height H5 of 5 nm or less. Due to the aforementioned stress balancing between oxidized semiconductor spacer 25 and pedestal 30, the amount of mechanical stress is reduced, and tail height H5 is reduced because of the less stress-enhanced oxidation During the oxidation process, mechanical stress can be imparted to the fin structure 10, due to volume expansion of the oxide as compared with silicon. Normally, this could cause the fin structure 10 to mechanically shift or tilt, relative to the horizontal, such that the fin structure 10 would no longer be perpendicular to the bulk substrate 5. However, due to embodiments of the present disclosure, the dielectric fill 35, being in direct physical contact with the fin structures 10, the fin structure 10 is held firmly in place by the dielectric fill 35 during the formation of the oxidized base portion 40, and so the undesirable mechanical shift is prevented.

Figure 8:
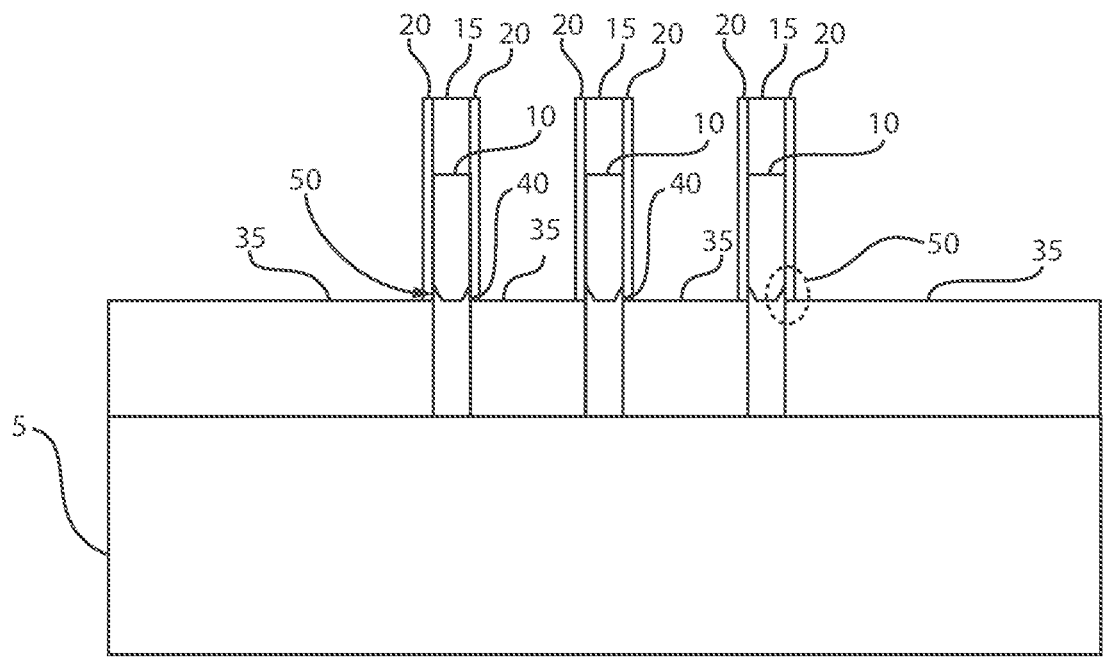
FIG. 8 is a side cross-sectional view depicting recessing the dielectric fill, in accordance with one embodiment of the present disclosure.

FIG. 8 depicts one embodiment of recessing the dielectric fill 35. In some embodiments, the dielectric fill 35 may be recessed using an anisotropic etch process, that removes the material of the dielectric fill 35 selectively to the dielectric fin cap 15. The etch process for recessing the dielectric fill 35 may also be selective to the dielectric spacers 20. One example of an etch process for recessing the dielectric fill includes RIE. Other examples of anisotropic etching that can be used at this point of the present disclosure include ion beam etching, plasma etching or laser ablation. Typically, the anisotropic etch is timed so that the dielectric fill 35 is recessed to expose the dielectric spacers 20. Typically, the etch process that recessed the dielectric fill 35 will also remove the oxidized semiconductor spacer 25b. In some embodiments, the methods and structures disclosed herein address the stress non-uniformity that occurs during oxidation, that causes unbalanced oxidation rates and therefore, non-uniform fin tail. In some embodiments, the fin tail is reduced with a balanced stress profile along the height.

Figure 9:
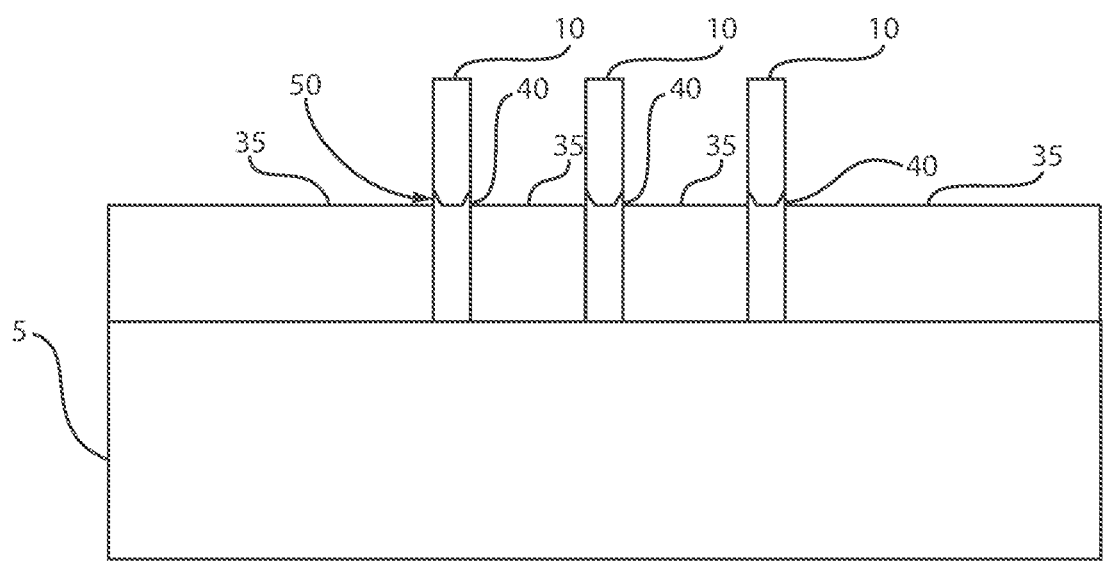
FIG. 9 is a side cross-sectional view depicting removing the dielectric spacer from the sidewall of the fin structures.

FIG. 9 depicts one embodiment of removing the dielectric spacer 20 from the sidewall of the fin structures 10. The dielectric spacer 20 may be removed using an etch process that removes the material of the dielectric spacer 20 selectively to the fin structures 10, the remaining portion of the dielectric fill 35 and the tail region 50. The etch process for removing the dielectric spacer 20 may be an anisotropic etch, such as RIE. In another embodiment, the etch process for removing the dielectric spacer 20 may be an isotropic etch, such as a wet chemical etch or a dry etch, e.g., plasma etch. The etch process for removing the dielectric spacer 20 may also remove the dielectric fin cap 15. Removing the dielectric fin cap 15 is optional. Typically, the dielectric fin cap 15 may remain when the fin structure 10 is employed in a fin field effect transistor (finFET), and the dielectric fin cap 15 is removed the fin structure 10 is employed in a tri-gate semiconductor device.

Figure 10:
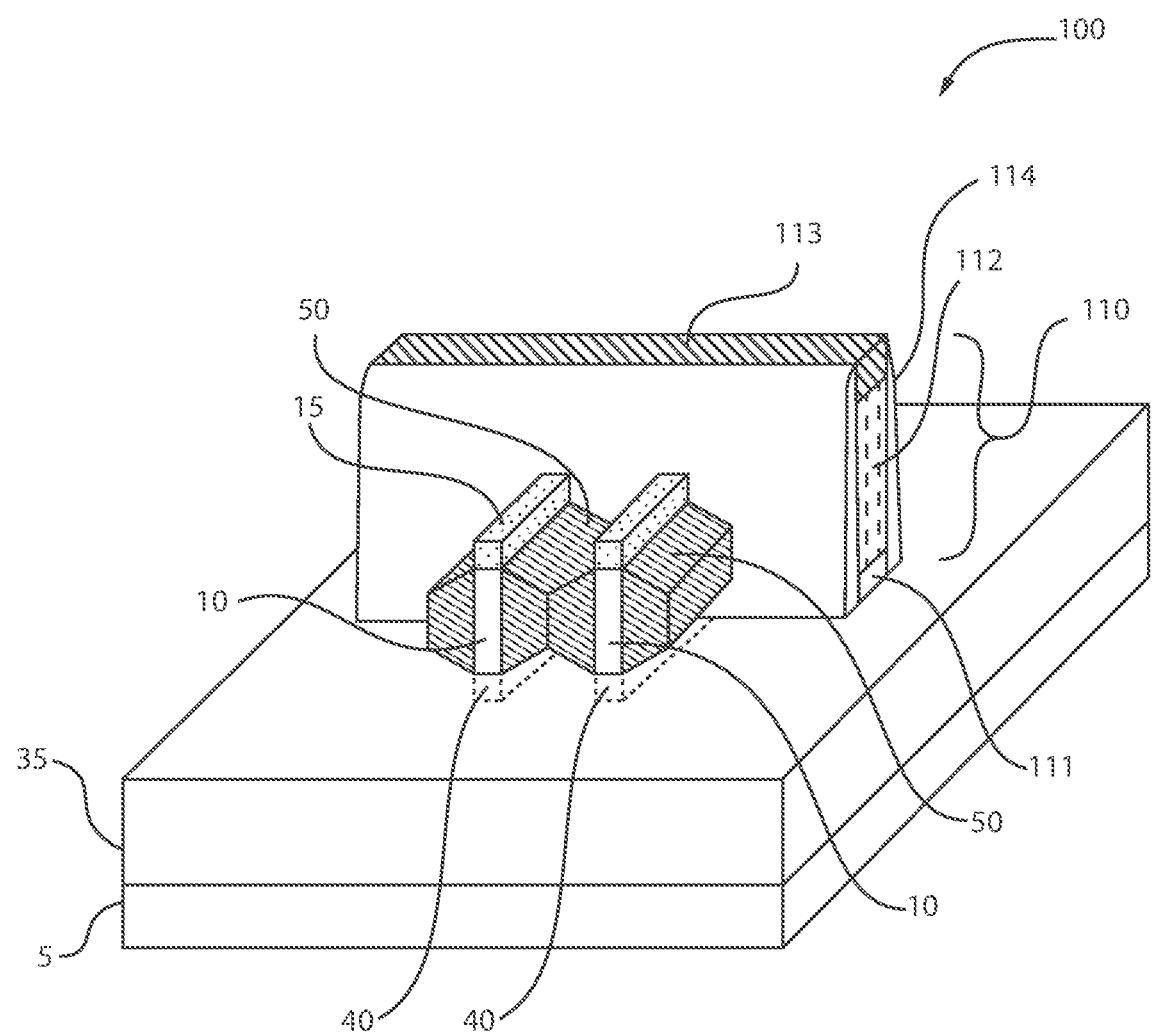
FIG. 10 is a side cross-sectional view depicting one embodiment of a finFET structure that may be formed using the process flow that is depicted in FIGS. 1-9, in accordance with the present disclosure.

FIG. 10 is a of a finFET structure 100 that may be formed using the fin structure 10 formed by the process flow that is depicted in FIGS. 1-9. A "field effect transistor (FET)" is a semiconductor device in which the output current, i.e., source-drain current, is controlled by the voltage applied to the gate. A FET has three terminals, i.e., gate structure, source region and drain region. A gate structure is a structure used to control output current (i.e., flow of carriers in the channel) of a semiconducting device through electrical or magnetic fields. A finFET is a field effect transistor in which at least the channel portion of the field effect transistor is present in a fin structure 10. The channel is the region underlying the gate structure and between the source and drain of a semiconductor device that becomes conductive when the semiconductor device is turned on. Although FIG. 10 only depicts two finFET devices being formed from two fin structures 10, any number of finFET devices may be formed using any number of fin structures 10.

In one embodiment, each of the finFET devices includes a gate structure 110 that may be composed of at least one gate dielectric layer 111, at least one gate conductor layer 112 and at least one gate dielectric cap 113. The at least one gate dielectric layer 111 is composed of an insulator, and is present between the channel region of the fin structure 10 and the at least one gate conductor layer 112 of the gate structure 110. The gate structure 110 may be formed by forming blanket material layers for the at least one gate dielectric layer 111, the at least one gate conductor layer 112, and the at least one gate dielectric cap 112 to provide a gate stack, and patterning and etching the gate stack to provide the gate structure 110 utilizing photolithography and etch process steps.

The at least one gate dielectric layer 111 is typically positioned on at least a portion of the sidewalls of the fin structures 10. The at least one gate dielectric layer 111 may be formed by a thermal growth process such as, e.g., oxidation, nitridation or oxynitridation. In other embodiments, the at least one gate dielectric layer 111 may be formed using a deposition process, such as CVD. In some embodiments, the at least one gate dielectric layer 111 is composed of a low-k dielectric material, such as silicon oxide ($SiO_2$), which typically has a dielectric constant of less than 4.0 at room temperature, e.g. 25° C. In some embodiments, the at least one gate dielectric 111 is composed of a high-k dielectric material. High-k dielectric materials have a dielectric constant greater than silicon oxide ($SiO_2$) at room temperature, e.g., 25° C. For example, a high-k dielectric composed of hafnium oxide ($HFO_2$), may have a dielectric constant of 4.0 or greater.

In one embodiment, the at least one gate dielectric layer 111 may include, but is not limited to, an oxide, nitride, oxynitride and/or silicates including metal silicates, aluminates, titanates and nitrides. In one example, when the at least one gate dielectric layer 11 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 111 may vary, but typically, the at least one gate dielectric layer 111 has a thickness ranging from 1 nm to 10 nm.

The at least one gate conductor layer 112 may be composed of polysilicon, SiGe, a silicide, a metal or a metal-silicon-nitride, such as Ta—Si—N. Examples of metals that can be used as the at least one gate conductor layer 112 include, but are not limited to Al, W, Cu, Ti or other like conductive metals. The physical thickness of the at least one gate conductor layer 112 may range from 1 nm to 10 nm. The gate dielectric cap 113 may be composed of a nitride, oxide, oxynitride material, and/or any other suitable dielectric layer.

A gate sidewall spacer 114 may be formed in direct contact with the gate structure 110. The gate sidewall spacer 114 may be formed using deposition and etch processes. The gate sidewall spacer 114 may be composed of a dielectric material, such as oxides, nitrides or oxynitrides.

Still referring to FIG. 10, a source region 50 and a drain region (not shown as hidden by gate structure in this view) may be formed on opposing sides of the gate structure 110, i.e., on opposing sides of the portion of the fin structure 10 including the channel region. In some embodiments, the source region 50 is a doped region in the finFET device, in which majority carriers are flowing into the channel region, and the drain region is a doped region in the finFET device located at the end of the channel region, in which carriers are flowing out of the finFET through the drain. N-type finFET devices are produced by doping the source region 50 and the drain region with elements from group V of the Periodic Table of Elements. In one embodiment, the group V element is phosphorus, antimony or arsenic. P-type finFET devices are produced by doping the source region 50 and the drain region with elements from group III of the Periodic Table of Elements. In one embodiment, the group III element is boron, aluminum, gallium or indium. In one embodiment, the source region 50 and the drain region are formed by ion implanting the exposed portions of the fin structures 10 that are on opposing sides of the gate structure 110. In another embodiment, the source region 50 may be formed by epitaxially forming a p-type or n-type dopant on the exposed portion of the fin structure 10 and driving the dopant from the epitaxially formed material into an extension region of the fin structure 10 using an annealing process.

Figure 11:
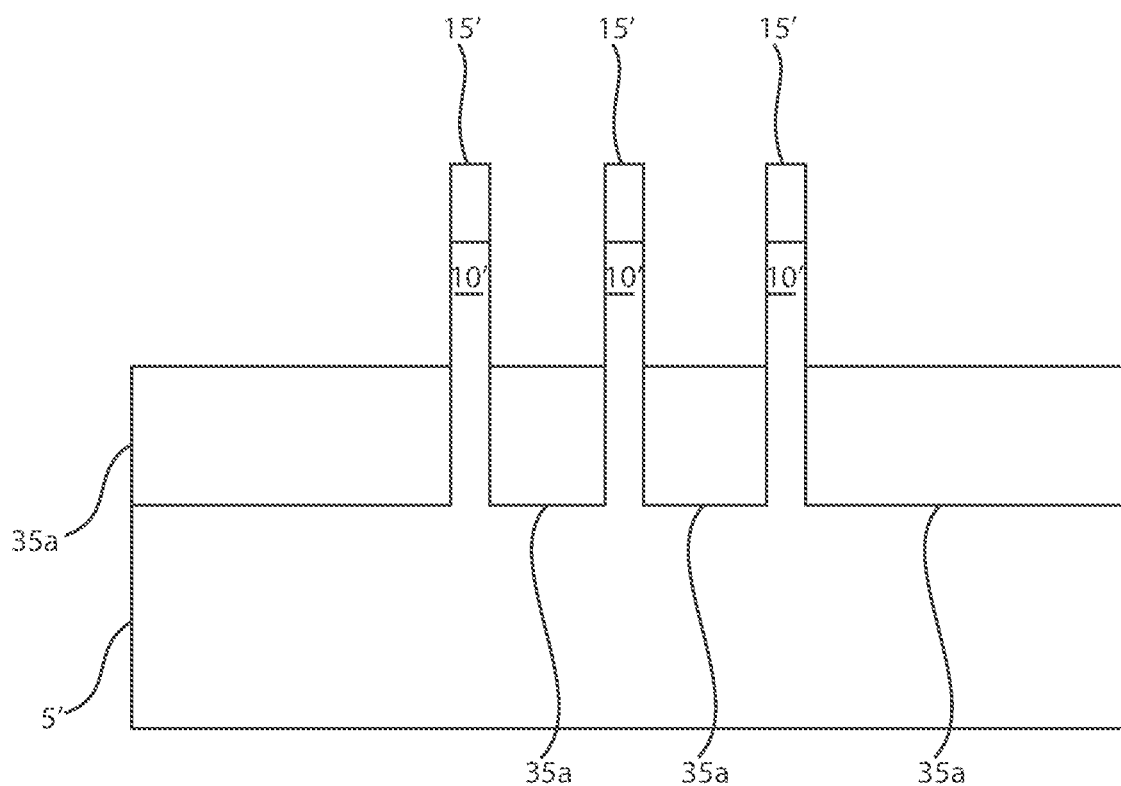
FIG. 11 is a side cross-sectional view depicting another embodiment of a method for forming a fin structure, in which a plurality of fin structures are formed from a bulk semiconductor substrate, and a first dielectric fill is formed in the space between the adjacent fin structures.

FIGS. 11-16 depict another method for forming a fin structure 10', in which a plurality of fin structures 10' are formed from a bulk semiconductor substrate 5'. FIG. 10 depicts one embodiment of forming a plurality of fin structure 10' from a bulk semiconductor substrate 5', and forming a first dielectric fill 35a in the space, e.g., trenches, between the adjacent fin structures 10'. The fin structures 10' that are depicted in FIG. 11 are similar to the fin structures 10 that are described above with reference to FIG. 1. Therefore, the description of the fin structures 10, the bulk substrate 5, and the dielectric cap 15 that are depicted in FIG. 1 are suitable for the fin structures 10', the bulk substrate 5', and the dielectric cap 15' that are depicted in FIG. 11.

In some embodiments, the first dielectric fill 35a is deposited in the space between the adjacent fin structures 10' using a deposition process, such as CVD, and may be recessed by etch process, such as RIE. The first dielectric fill 35a may be an oxide, nitride or oxynitride material. In one example, the first dielectric fill 35a is composed of silicon oxide ($SiO_2$). It is noted that the above provided compositions for the first dielectric fill 35a are provided for illustrative purposes only, and that the present disclosure is not intended to be limited thereto. For example, the materials described above for the dielectric fill 35 depicted in FIG. 5 are suitable for the first dielectric fill 35a that is depicted in FIG. 11. The etch process for recessing the first dielectric fill 35a may be a selective etch process that removes the material of the dielectric fill 35a selectively to the dielectric cap 15'. The first dielectric fill 35a may be recessed until the sidewall for the desired height of the fin structure 10' is exposed.

Figure 12:
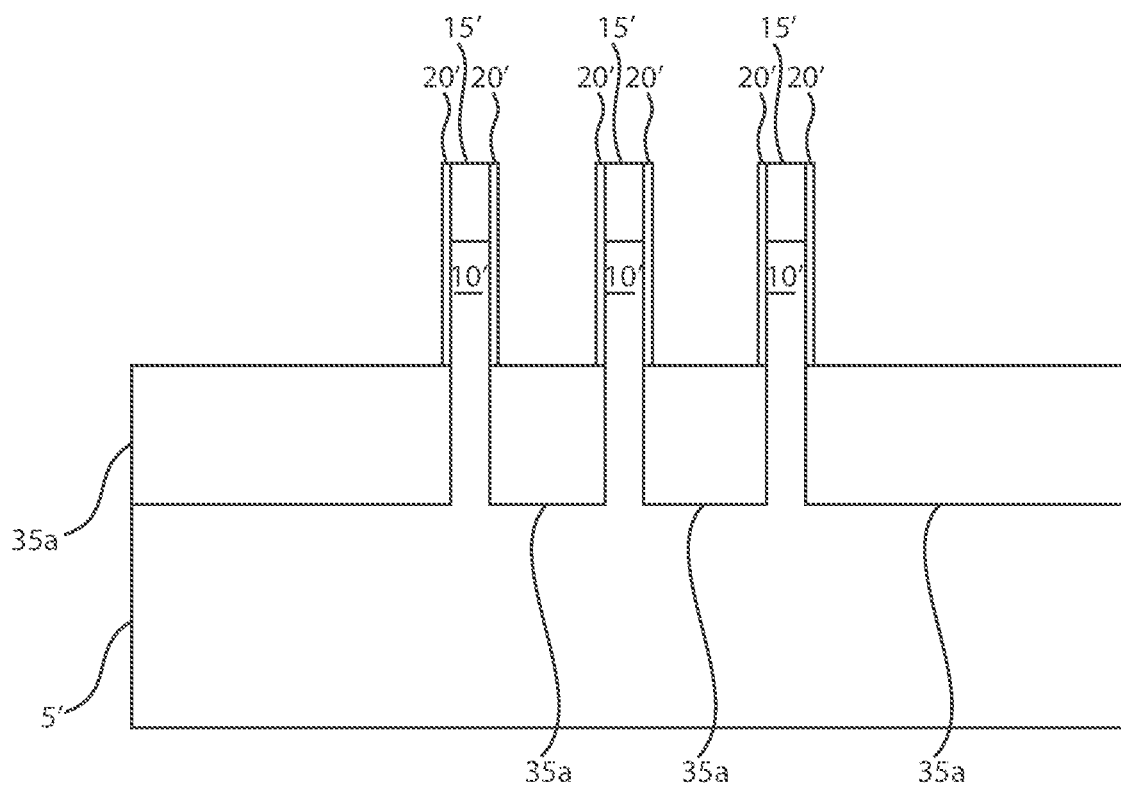
FIG. 12 is a side cross-sectional view depicting forming a dielectric spacer on the exposed sidewalls of each fin structure in the plurality of fin structures that are depicted in FIG. 11, in accordance with one embodiment of the present disclosure.

FIG. 12 depicts one embodiment of forming a dielectric spacer 20' on the exposed sidewalls of each fin structure 10' that is depicted in FIG. 11. The description of the dielectric spacer 20 that is depicted in FIG. 2 is suitable for one embodiment of the dielectric spacer 20' that is depicted in FIG. 12.

Figure 13:
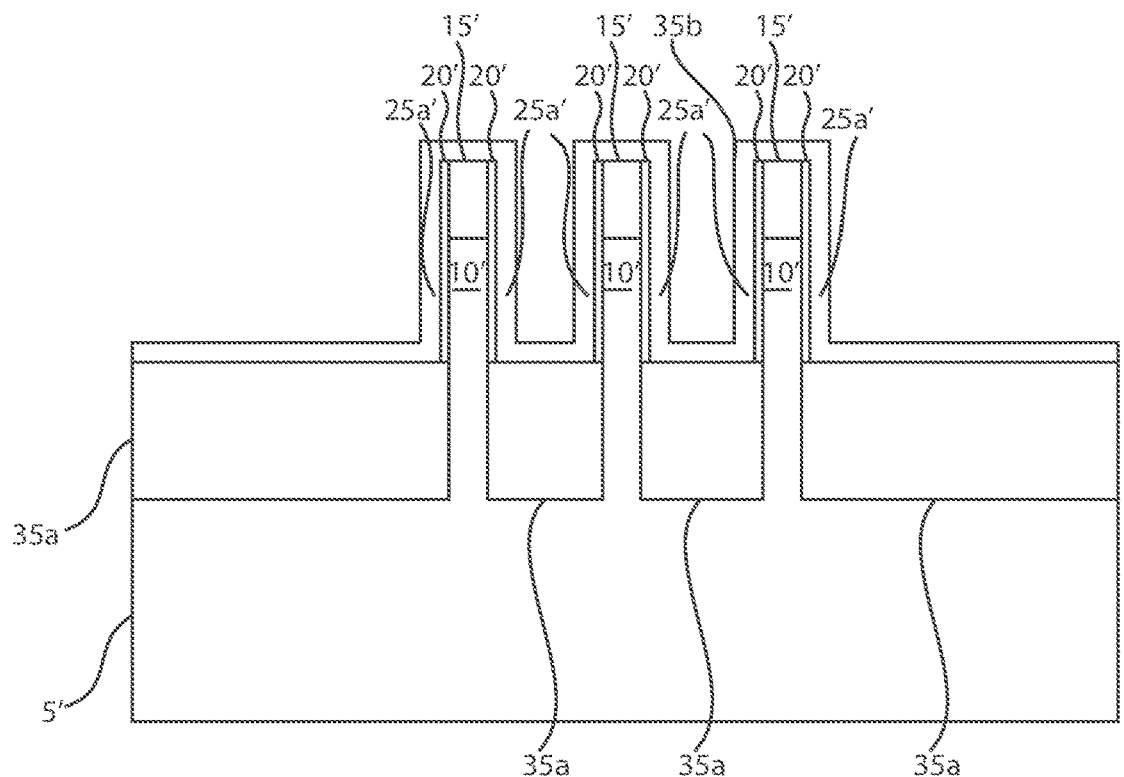
FIG. 13 is a side cross-sectional view depicting one embodiment of forming a conformal layer of a semiconductor material on the dielectric spacer, the plurality of fin structures and upper surface of first dielectric fill that is present between adjacent fin structures of the plurality of fin structures that are depicted in FIG. 12, in accordance with the present disclosure.

FIG. 13 depicts one embodiment of forming a conformal layer of a semiconductor material 25' on the dielectric spacer 20', the plurality of fin structures 10' and upper surface of first dielectric fill 35a that is present between the adjacent fin structures 10' that are depicted in FIG. 12. The description of the conformal layer of a semiconductor material 25 that is depicted in FIG. 3 is suitable for one embodiment of the conformal layer of a semiconductor material 25' that is depicted in FIG. 13.

Figure 14:
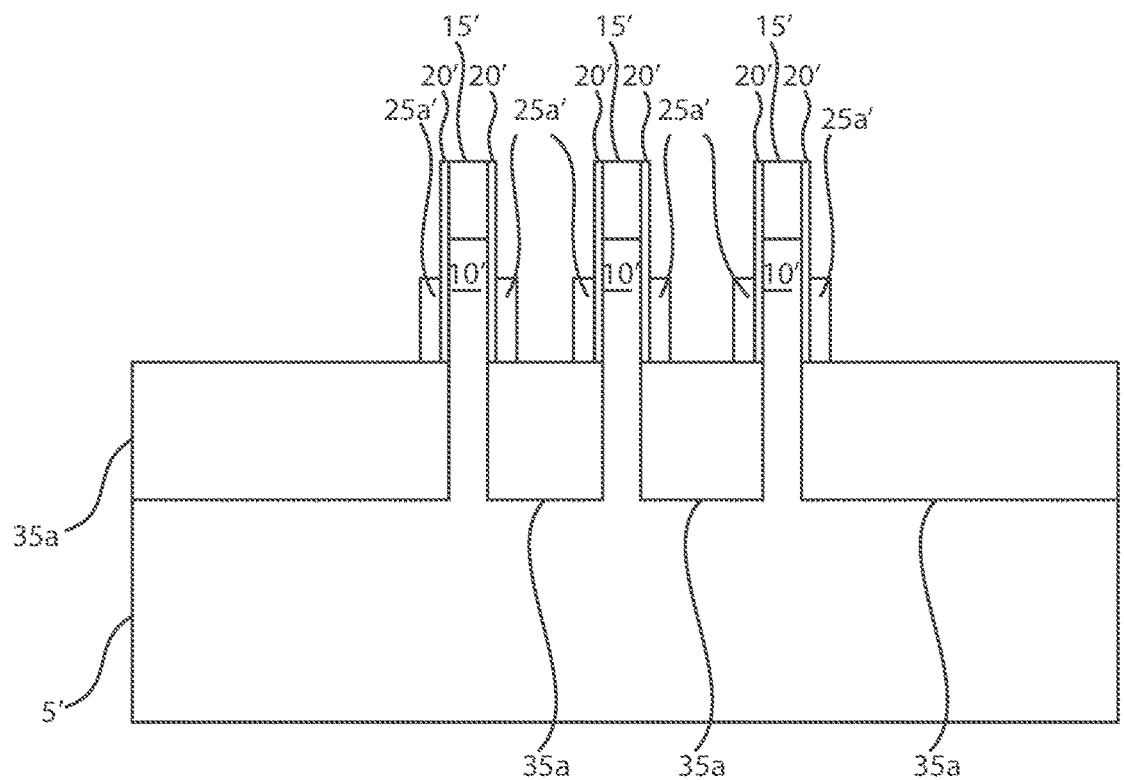
FIG. 14 is a side cross-sectional view depicting one embodiment of anisotropically etching the conformal layer of the semiconductor material to provide semiconductor spacers on a sidewall of the dielectric spacer, in accordance with the present disclosure.

FIG. 14 depicts one embodiment of etching the conformal layer of the semiconductor material to provide semiconductor spacers 25a' on a sidewall of the dielectric spacer 20'. The etch process for forming the semiconductor spacers 25a may be an anisotropic etch, such as RIE, ion beam etching, plasma etching or laser ablation. The etch process for forming the semiconductor spacers 25a' may be an etch that removes the material of the semiconductor spacers 25a' selectively to the material of the dielectric cap 15' and the first dielectric fill 35a'.

Figure 15:
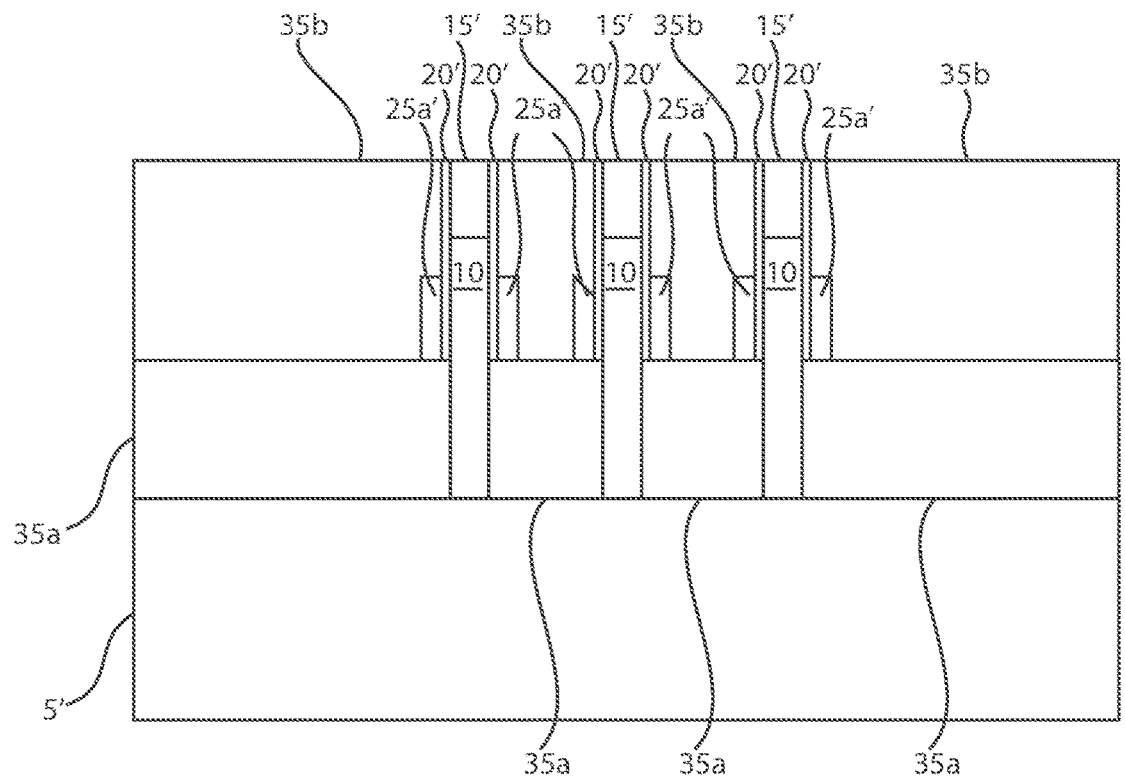
FIG. 15 is a side cross-sectional view depicting forming a second dielectric fill in the space between the adjacent fin structures on the first dielectric fill, in accordance with one embodiment of the present disclosure.

FIG. 15 depicts one embodiment of forming a second dielectric fill 35b in the space between the adjacent fin structures 10' on the first dielectric fill 35a. The second dielectric fill 35b may be an oxide containing material. For example, the second dielectric fill 35b may be silicon oxide ($SiO_2$). Other examples of materials that may be employed for the second dielectric fill 35b include silicon nitride, silicon oxynitride, hafnium oxide, hafnium oxynitride, alumina and combinations thereof. The dielectric fill may be formed using CVD, PECVD, high-density plasma CVD (HPCVD), chemical solution deposition or a spin-on glass process. Following deposition, the material for the second dielectric fill 35b may be planarized so that the upper surface of the dielectric fill is coplanar with the upper surface of the dielectric cap 15.

Figure 16:
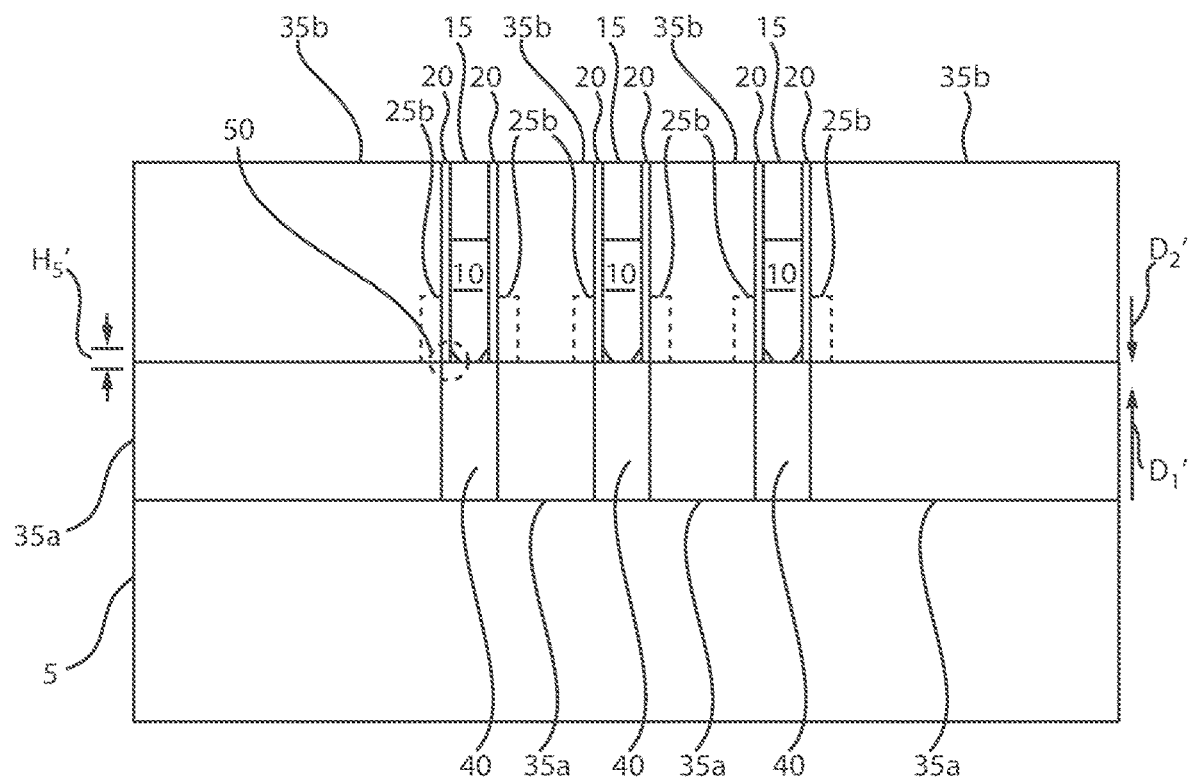
FIG. 16 is a side cross-sectional view depicting one embodiment of oxidizing the semiconductor spacer and a portion of the fin structures that is present below a lower surface of the dielectric spacer, in accordance with the present disclosure.

FIG. 16 depicts one embodiment of oxidizing the semiconductor spacer to form an oxidized semiconductor spacers 25b', and oxidizing a portion of the fin structures 10' that is present below a lower surface of the dielectric spacer 20' to form an oxidized base portion One embodiment for the oxidation step that provides the oxidized semiconductor spacers 25b' and the oxidized base portion is described above with reference to FIG. 7. Similar to the oxidized base portion 40 and the oxidized semiconductor spacer 25b that are described above and depicted in FIG. 7, the oxidized base portion that is depicted in FIG. 16 produces a first strain in a first direction D1' and the oxidized semiconductor spacer 25b that is depicted in FIG. 16 produces a second strain in second direction D2' that is opposite the first strain. Therefore, the description of the oxidized semiconductor spacer 25b, and the second strain produced by the oxidized semiconductor spacer 25b, that are depicted in FIG. 7 is suitable for the oxidized semiconductor spacer 25b' that is depicted in FIG. 16. Further, the description of the oxidized base portion 40, and the first strain produced by the oxidized base portion 40, that is depicted in FIG. 7 is suitable for the oxidized base portion that is depicted in FIG. 16.

The strain produced by the oxidized semiconductor spacer 25b' in the second direction D2' opposes the strain produced by the oxidized base portion 40 in the first direction D1' to provide a fin structure 10' that is substantially relaxed. In some embodiments, the strain that can be measured in the relaxed fin structure 10' that results from the opposing strains produced by the oxidized semiconductor spacer 25b' and the oxidized base portion may range from 0.1 GPa tensile to −0.1 GPa compressive strain. In yet another embodiment, the strain that can be measured in the relaxed fin structure 10' that results from the opposing strains produced by the oxidized semiconductor spacer 25b' and the oxidized base portion may range from 0.05 GPa tensile to −0.05 GPa compressive strain. In one example, the fin structure 10' may be completely relaxed.

In some embodiments, an oxide region 50' having a triangular-shaped cross-section or tail profile (hereafter referred to as a tail region 50) is present at an interface between the unoxidized portion of the fin structure 10' and the oxidized base portion of the fin structure 10'. In some embodiments, the tail region 50 may have a height H5' of less than 5 nm. In a following process sequence, the second dielectric fill 35b is recessed to expose the dielectric spacers 20', and the dielectric spacers 20' are removed. The process sequence for recessing the second dielectric fill 35b has been described above for recessing the dielectric fill 35 that is depicted in FIG. 7. The process sequence for removing the dielectric spacers 20' has been described above for removing the dielectric spacers 20 that are depicted in FIG. 8.

A semiconductor device, such as the finFET structure 100 depicted in FIG. 10 may be formed from the fin structures 10' that are formed using the process sequence described with reference to FIGS. 11-16. Further details regarding forming the gate structure and the source and drain regions for a finFET structure including the fin structure 10' formed using the process sequence depicted in FIGS. 11-16 is described above with reference to FIG. 10.

In another embodiment, the process sequence for forming the finFET structure 100 depicted in FIG. 10 including the fin structures 10 formed using the method described with reference to FIGS. 1-9 or the fin structures 10' formed using the method described with reference to FIGS. 11-16 includes a gate last process sequence, which is not depicted in the supplied figures. A gate last process includes forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A fin field effect transistor (finFET) comprising:
a semiconductor portion of a fin structure that is present on a dielectric base portion of the fin structure, wherein at least two peak uniform tail region portions each having a triangular cross section that are present at an interface of the semiconductor portion of the fin structure and the dielectric base portion of the fin structure one of each of the at least two peak uniform tail regions portions on opposing sidewalls of the fin structure, the at least two peak uniform tail regions connected by a centrally positioned planar upper surface of the dielectric base portion of the fin structure;
a gate structure present on a portion of the fin structure including a gate dielectric in contact with a channel portion of the fin structure; and
a source region and a drain region on opposing sides of the channel portion of the fin structure.

2. The finFET of claim 1, wherein the uniform tail region is composed of silicon oxide and has a triangular cross section.

3. The finFET of claim 1, wherein the fin structure comprises a semiconductor material selected from the group consisting of silicon, a silicon carbon alloy, silicon germanium, a silicon germanium with carbon alloy, germanium, gallium arsenic, indium arsenic, indium phosphide and combinations thereof.

4. The FinFET of claim 1, wherein a dielectric cap is present atop the fin structure.

5. The FinFET of claim 1, wherein the fin have a height ranging from 5 nm to 200 nm.

6. The FinFET of claim 1 further comprising spacers adjacent to the fin structure, the spacers are comprised of a semiconductor material selected from the group consisting of Si, SiGe, SiGeC, SiC, polysilicon and combinations thereof.

7. The FinFET of claim 6, wherein the semiconductor material is oxidized.

8. The finFET of claim 1, wherein the fin structure is substantially relaxed having a strain no greater than about +/−0.1 Gpa.

9. A fin field effect transistor (finFET) comprising:
a fin structure that is present on a dielectric surface, wherein a uniform tail region is present at an interface of the fin structure and the dielectric surface, the uniform tail region including an oxide region on each side of the fin structure that are separated by a semiconductor material of the fin structure;
a gate structure present on a portion of the fin structure including a gate dielectric in contact with a channel portion of the fin structure;
a gate sidewall spacer that has a compensatory strain that neutralizes strain in the dielectric surface from impacting said fin structure; and
a source region and a drain region on opposing sides of the channel portion of the fin structure.

10. The finFET of claim 9, wherein the uniform tail region is composed of silicon oxide and has a triangular cross section.

11. The FinFET of claim 9 further comprising spacers adjacent to the fin structure, the spacers are comprised of a semiconductor material selected from the group consisting of Si, SiGe, SiGeC, SiC, polysilicon and combinations thereof.

12. The FinFET of claim 11, wherein the semiconductor material is oxidized.

13. The finFET of claim 9, wherein the fin structure is substantially relaxed having a strain no greater than about +/−0.1 Gpa.

* * * * *